United States Patent [19]

Seffernick et al.

[11] Patent Number: 5,621,619

[45] Date of Patent: Apr. 15, 1997

[54] ALL CERAMIC SURFACE MOUNT SIP AND DIP NETWORKS HAVING SPACERS AND SOLDER BARRIERS

[75] Inventors: Lewis L. Seffernick, Decatur; Neal F. Thomas, Elkhart, both of Ind.

[73] Assignee: CTS Corporation, Elkhart, Ind.

[21] Appl. No.: 445,237

[22] Filed: May 19, 1995

Related U.S. Application Data

[63] Continuation of Ser. No. 74,039, Jun. 1, 1993, abandoned, which is a continuation of Ser. No. 603,912, Oct. 25, 1990, abandoned.

[51] Int. Cl.⁶ .................................................. H01R 9/00
[52] U.S. Cl. .................. 361/773; 174/138 G; 257/692; 257/693; 338/277; 338/319; 338/320; 338/313; 361/772
[58] Field of Search ................. 174/52.1, 52.4, 174/52.3, 138 G; 338/277, 319, 320, 260, 309, 313; 257/692, 653, 723, 724, 778, 693, 737, 772, 773; 361/760, 767, 768, 770, 771–773, 777, 779, 782, 807, 811, 820; 439/68, 83, 476; 228/180.21, 180.22, 179.1, 180.1; 333/185

[56] References Cited

U.S. PATENT DOCUMENTS

| | | | |
|---|---|---|---|
| 3,280,378 | 10/1966 | Brady et al. | 361/402 |
| 3,346,774 | 10/1967 | Brady | 361/402 |
| 3,444,436 | 5/1969 | Coda | 361/405 |
| 3,483,308 | 12/1969 | Wakely | 361/773 |
| 3,492,536 | 1/1970 | Girolamo et al. | 361/402 |
| 3,621,112 | 11/1971 | Stickley | 361/405 |
| 3,838,316 | 9/1974 | Brown et al. | 361/405 |
| 3,873,890 | 3/1975 | Beckman et al. | 361/402 |
| 3,902,189 | 8/1975 | Simpson | 228/215 |
| 4,187,529 | 2/1980 | Bartley et al. | 361/402 |
| 4,345,300 | 8/1982 | Stuckey | 361/402 |
| 4,373,655 | 2/1983 | McKenzie, Jr. | 228/215 |
| 4,376,505 | 3/1983 | Wojcik | 228/215 |
| 4,389,771 | 6/1983 | Cassidy et al. | 228/215 |
| 4,400,762 | 8/1983 | Bartley et al. | 361/402 |
| 4,419,714 | 12/1983 | Locke | 361/321.2 |
| 4,641,222 | 2/1987 | Derfiny et al. | 361/403 |
| 4,697,204 | 9/1987 | Mita et al. | 357/80 |
| 4,878,611 | 11/1989 | Lo Vasco et al. | 228/180.22 |
| 4,918,277 | 4/1990 | Zimmer | 228/215 |
| 5,025,306 | 6/1991 | Johnson et al. | 257/724 |
| 5,142,268 | 8/1992 | Clark et al. | 338/320 |
| 5,239,198 | 8/1993 | Lin et al. | 257/693 |
| 5,334,968 | 8/1994 | Negoro | 338/320 |
| 5,521,420 | 5/1996 | Richards et al. | 257/693 |

FOREIGN PATENT DOCUMENTS

| | | | |
|---|---|---|---|
| 2223262 | 11/1972 | Germany | 411/401 |
| 59-45985 | 3/1984 | Japan | 257/693 |
| 2-30169 | 1/1990 | Japan | 257/693 |
| 2-177464 | 7/1990 | Japan | 257/787 |
| 2249746 | 5/1992 | United Kingdom | 228/179.1 |

OTHER PUBLICATIONS

IBM Technical Disclosure Bulletin "Solderless Multi-Chip Module Attachment In Vertical Fashion" vol. 33 No. 4 Sep. 1990.

IBM Disclosure Bulletin "Pin-Brazing Apparatus with Thermal Gas Pin-Preloading System" by Balder et al. vol. 26 No. 8 Jan. 1984.

*Primary Examiner*—Donald Sparks
*Attorney, Agent, or Firm*—Albert W. Watkins; Michael W. Starkweather

[57] ABSTRACT

A resistor network is disclosed which is suited for surface mount which does not incorporate wire terminations. The network is fabricated entirely from cermet, ceramic, and solder, yet will absorb thermal stresses normally associated with circuitry energization when properly mounted upon a substrate. This is accomplished by controlling the formation of solder bumps and simultaneously controlling the mounted distance between those bumps and a wiring substrate upon which the network is mounted. Additionally, the network may be formed to be either a SIP or DIP configuration, depending upon whether an additional groove is incorporated into the termination side of the substrate. Two alternative embodiments are also disclosed which incorporate various features of the invention.

13 Claims, 5 Drawing Sheets bandaisha# ALL CERAMIC SURFACE MOUNT SIP AND DIP NETWORKS HAVING SPACERS AND SOLDER BARRIERS This application is a file-wrapper continuation of application Ser. No. 08/074,039 filed Jun. 1, 1993, now abandoned; which is a file-wrapper continuation of application Ser. No. 08/603,912 filed Oct. 25, 1990, now abandoned.

BACKGROUND OF THE INVENTION

1. Field of the Invention

This invention pertains to surface mount devices generally, and specifically to surface mount resistor networks.

2. Description of the Related Art

High quality resistor networks are typically made from ceramic substrates which have patterned thereon ceramic-metal composite conductors. These cermet conductors are fired at elevated temperatures, typically 800°–1000° C. The thusly formed cermet resistors have performance characteristics which are significantly better than lower temperature polymeric resistor materials. However, the elevated firing temperature does necessitate the use of ceramic substrates.

Due to local heating of a resistor element, sudden changes in the ambient or other causes, a finished and mounted resistor network will rarely always see the same temperature and rate of temperature change as the wiring substrate that the network is attached to. Such variances result in differing expansion and contraction, which will produce stresses between the network and the substrate. Those thermally induced stresses can result in interconnection failure if not properly relieved. In the prior art, such stresses were readily relieved by elastic deformation of the lead wires of the resistor network. However, this type of stress relief is not available in those instances where the manufacturer has required surface mount devices where there is not adequate space for lead wires. This lack of stress relief is emphasized in those instances where the application requires the performance characteristics best obtainable with unyielding ceramic substrates and cermet conductors and resistors. Therefore some other way must be found to solve thermal stress problems if the manufacturer is still going to be able to take for granted the quality available from cermet resistors and yet design high speed, densely packed circuitry.

As modern electronic devices become faster and more densely packed, there is a continuing trend towards the attachment of devices with little if any electrical wire intermediary to the device and a substrate. Generally, any wiring will be present only on or within the substrate and extra wire extending from a component may be regarded as being deleterious to performance, packaging density, and suitability for multi-layer printed wiring boards. This is because the wire introduces additional connections between the component and the board (component to wire to board as opposed to component to board) which reduces the overall reliability somewhat. The wire additionally requires a finite amount of space which reduces packing density and which in high speed circuitry may introduce signal propagation delay and noise and signal degradation. Additionally, the wire may require additional holes through the circuit board for mounting each termination. The through holes that are required must be drilled through each layer of the circuit board and therefore require vacancies in the wiring pattern which complicates wiring layout.

Unfortunately, where a different resistor substrate material is used from that of the wiring substrate, or where the resistor substrate is thermally remote from the wiring substrate, differences in expansion and contraction are often emphasized sufficiently that failure does occur in the interconnection between the resistor network and the wiring substrate.

Some of the prior art attempts at overcoming this mechanism of failure have included attaching a miniature lead-frame from the bottom of the resistor to the wiring board, or in another device, wrapping a lead-frame entirely around the device and encapsulating the device in plastic. The plastic and lead-frame are much more resilient than the ceramic resistor substrate and will in many cases suffice to prevent disruption of the interconnection between the resistors and the wiring substrate.

However, the assembly of the resistor network is complicated very much by the incorporation of the lead-frame, making the finished device more expensive to produce. Additionally, the application of this technology to smaller production quantities becomes entirely cost prohibitive and the space for this technology may not exist at all as designs become progressively smaller.

Related technologies such as chip resistor and chip capacitor design have in the past included features to prevent failure of the device interconnection to the wiring substrate. One known method is to form a solder fillet between the chip and the wiring substrate of a particular shape which reduces the stress within the solder at any one point to a minimum. In this way, the solder is able to accommodate stresses by slight elastic deformation through the normal temperature excursions which the wiring substrate and the chip would be exposed. However, there has heretofore not been any economical application of chip technology to resistor networks, presumably for several reasons.

The first of these reasons is the increased overall dimension of a resistor network. The chip merely requires the printing of two terminations and one resistor between those two terminations. In the case of a resistor network, there is typically more than one external termination for every resistor printed upon the network substrate. This may run to twenty or more terminations on occasion. The increased dimension necessitated by the multiple terminations translates into greater actual differences in dimensional changes between the network and the wiring substrate with changes in temperature.

A second reason for the lack of application of the chip technology to resistor networks stems from the numbers of total terminations and the relative proximity of those terminations one to another. With a chip resistor, significant misalignment between the chip and the wiring substrate does not affect the interconnection integrity. However, where there are multiple terminations spread across a greater total dimension, alignment becomes much more critical. This may be further aggravated by manufacturing tolerances on the locations of the terminations. Generally, wire terminations may be used to compensate for misalignment and manufacturing tolerances, whereas a chip type design does not require nor incorporate any feature to accommodate this type of problem.

SUMMARY OF THE INVENTION

The present invention seeks to overcome the limitations of the prior art by providing dense, precisely controlled interconnection between a wiring substrate and a component. The component has incorporated therein one or more solder barriers which allow for a reduction in termination spacing. Additionally, a stress relieved interconnection may be achieved by controlling the spacing between the component substrate and the wiring substrate in a precise and highly predictable manner. The combination of solder barrier and controlled spacing further synergistically allows for the formation of a dual-in-line (DIP) package as opposed to the standard single-in-line (SIP) package, effectively eliminating half of the overall length of a component.

DESCRIPTION OF THE PREFERRED EMBODIMENT

Figure 1:
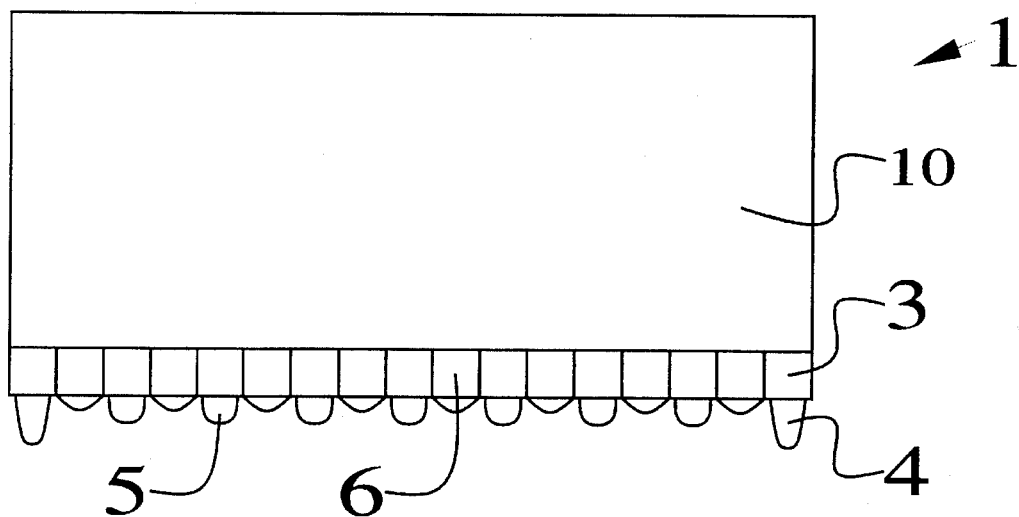
FIG. 1 illustrates a non-mounted surface mount resistor network which has been designed so as to incorporate the features of the present invention.

The resistor network which has been designed so as to incorporate the features of the present invention is illustrated in the figures. In FIG. 1, the network is identified generally by the numeral 1. The individual resistors (9 in FIG. 3) are illustrated as being protected from exposure to the ambient by a covercoat 10. The resistors are formed upon a generally planar ceramic surface 3 which extends not only under the resistors 9 and the covercoat 10, but slightly beyond the covercoat 10 and under one face of solder bumps 6. The unmounted network illustrated in FIGS. 1 and 2 best illustrates the source of the name "solder bumps," as element 6 takes on a somewhat rounded or bulging form. On the bottom surface of the resistor network there are additionally formed ceramic stand-offs 4 and 5. Those stand-offs referenced by the numeral 5 are somewhat smaller than the four corner stand-offs identified by the numeral 4. While only a few of the bumps and stand-offs are numbered for sake of clarity, the same numeral applies to each identical ceramic stand-off or solder bump. The only enlarged ceramic stand-offs 4 in the preferred embodiment are at the extreme corners of the bottom of the substrate. Other customer applications may allow for the designer to provide various placement of the larger stand-offs 4. The remaining ceramic stand-offs 5 are located between each adjacent solder bump 6.

The spacing of the solder bumps 6 by ceramic stand-offs 5 helps during manufacture to prevent solder bridging between terminations. Ceramic, in this case alumina, is not wet by the solder. As a result, the bumps 6 are formed to be of controlled and reproducible dimension.

The somewhat larger stand-offs 4 formed at the four extreme corners of the bottom of the ceramic 2 are provided as a second dimensional control. At the time of interconnection between the network 1 and the wiring substrate conductors 12, there is typically applied to the substrate conductors 12 a predetermined thickness of solder paste. Surface mount components are placed on top of and into this solder paste. In the present case, the solder bumps 6 would be slightly into the paste. This overlap between the paste and the solder bump is necessarily very critical, since, in the event of no overlap, no electrical interconnection will occur at the time of solder reflow. Too much overlap will result in a smearing of the solder paste beyond the resistor network 1, potentially to other surrounding components. Such an excessive overlap might result in solder bridging between the resistor network 1 and an adjacent component.

Referring again to the prior art chip component, where there are only two terminations, the issue of bridging or open connections is very minor, if it is even an issue at all. However, as the number of terminations is increased, variations in surface flatness of the wiring substrate, thickness of deposited solder paste, even surface asperities may substantially affect the overlap between the solder bumps 6 and the solder paste. Since tolerances from the wiring substrate 13 in relation to the network 1 are necessarily going to be worse than for chip components due to the increased area covered by the network 1, the designer must provide a means of tightly controlling the tolerances of the network features so that the solder bumps 6 will always be within tight tolerances a predetermined distance from the wiring substrate conductors 12. The stand-offs 4 and 5 provide an ideal way of accomplishing this control by both controlling the shape of formation of the solder bumps 6 and controlling the distance between the network substrate 2 and the wiring substrate 13.

Additionally, by precisely controlling the spacing between the termination conductive 11 and the wiring substrate conductor 12, a controlled solder fillet is formed which aids significantly in reducing yielding stress through available elastic deformation. In other words, by controlling the stand-off dimensions, a controlled and beneficial solder fillet 15 is produced.

Figure 2:
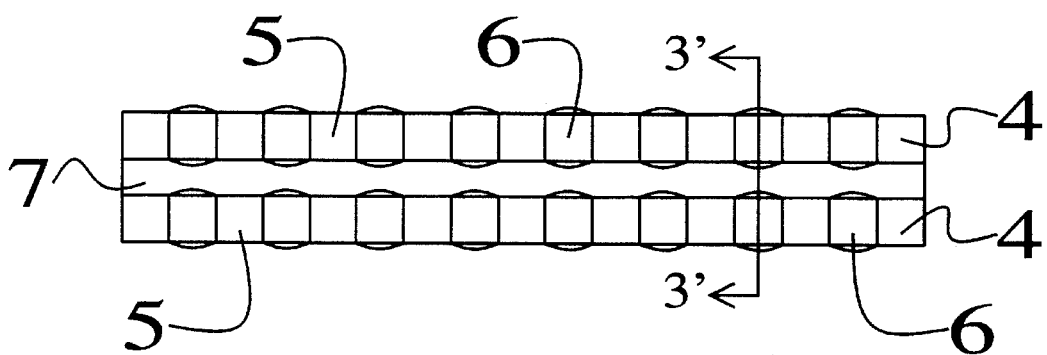
FIG. 2 illustrates the network of FIG. 1 from a bottom view so as to expose the terminations.
Figure 3:
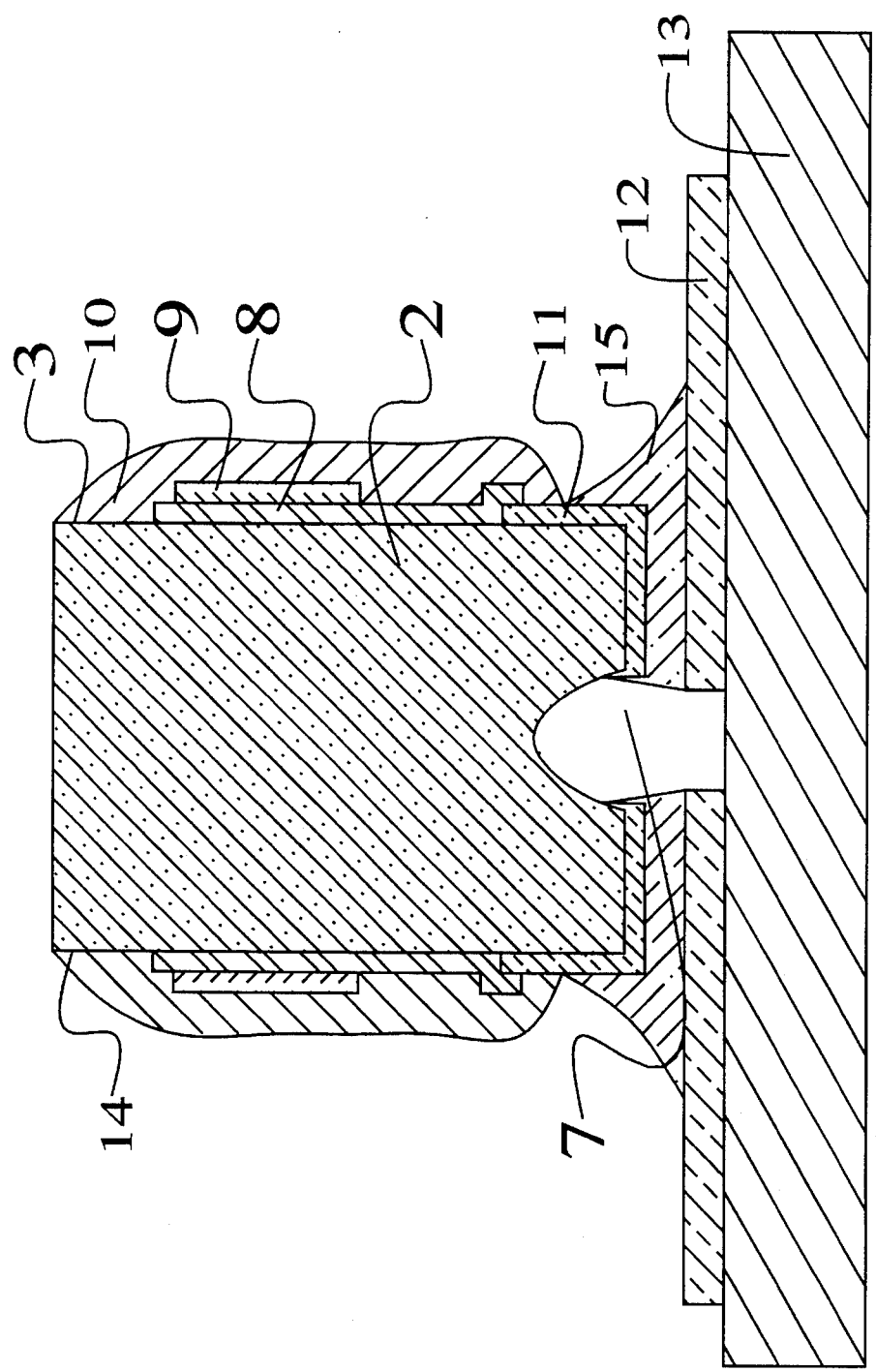
FIG. 3 illustrates a surface mounted resistor network otherwise identical to those of FIGS. 1 and 2 from a cross-section taken along line 3' of FIG. 2.

Referring to FIGS. 2 and 3, the preferred embodiment incorporates an additional feature. Groove 7 is formed in the bottom of substrate 2 to provide a physical separation between solder bumps 6 formed on a first face 3 of the substrate and on the opposite face 14. This physical separation allows for physical and electrical isolation between networks formed on each side of the substrate. As a result, a dual-in-line packaging format may be readily adopted. The significance of this ability arises from the reduction in overall length of the component to one-half of that normally required for a single-in-line package configuration. The reduction in length allows for increased manufacturing tolerances, better yields for both the network manufacturer and the end user, and the resultant lower costs associated therewith. Most importantly, DIP format cuts the substrate length nearly in half which reduces the stresses induced by different thermally induced expansions between the substrate of the network and the wiring substrate on which the network is mounted.

The solder barrier is illustrated in the preferred embodiment as a groove 7. This would typically be formed at the time of formation of the ceramic substrate, as would stand-offs 4 and 5. This is accomplished as is common knowledge in the art during the pressing of fine ceramic powder by using a forming die of appropriate dimension to produce the resultant features. This is done prior to the firing of the ceramic. Other equally satisfactory methods may be utilized, such as, for example, sand abrading. However, for reasons to be discussed shortly, the formation of a relatively circularly groove 7 at the time of pressing of the substrate is preferred.

Other methods may be incorporated for the formation of a solder barrier. Just as stand-offs 5 function to some degree as solder barriers, so could a similar lengthwise bump. However, the formation of a groove provides some limited relief area for otherwise excessive solder paste by providing a harmless region of increased volume into which the solder paste may flow at the time of component placement. The formation of a bump does not provide this advantage.

The combination of stand-offs 5 and specifically a groove for element 7 provides an additional advantage which is not obvious from the incorporation of either feature individually. Present technology for the formation of solder bumps 5 involves the application of some type of solderable material 11 to the substrate. In view of the irregularity of the surface to which this material must be deposited, some type of transfer process incorporating rollers, thin strips of metal, or other transfer process is generally involved. These transfer processes are very fast and amenable to volume production, but do not generally allow for placement of material separated in two axes along a planar surface. In other words, it is normally possible to form numerous parallel lines along a substrate by merely providing several rollers parallel to each other which roll over a substrate. However, to produce a discontinuous pattern in both x and y axes along a substrate requires the use, for example, of notched rollers which resemble gear teeth. Such notched rollers do not have the reliability necessary to provide high production yields. Other alternatives for discrete displacement in two axes might, for example, include the use of dispensing syringes. However, such syringes are not suited for high volume production and similarly may affect production yields.

The incorporation of groove 7 provides for two separate distinct halves of conductive material 11 from one side of substrate 2 to the opposite side. This is accomplished without the need to use elaborate syringes or unreliable gear type rollers. Verification of correct alignment of the transfer applicator is precisely accomplished via the stand-offs 5. Material is only transferred to those areas of contact, and is thus excluded from groove 7. While groove 7 could take a variety of shapes and be formed in a variety of ways, the semi-circular groove has been selected as preferred since stresses within the ceramic are minimized and depth is kept to a relative maximum. Standard sand abrading would require an additional processing operation and might result in an inadequate depth of formation. Selectively, groove 7 could be eliminated at one or more termination locations to allow conductive material 11 to connect circuitry on the front of the substrate to circuitry on the rear of the substrate.

Illustrated and not yet discussed is the final electrical connection which occurs as a result of surface mounting. Substrate 13 carries upon a surface some type of electrical conductor Upon reflow of any solder paste and solder bumps 6, a solder fillet 15 is formed. This solder acts as a mechanical and electrical interconnection to conductive coating 11, commonly referred to as a notch or edge-around material. Conductive material 8 is deposited on substrate 2 in a desired pattern, typically fired, and then redeposited with resistive material 9 and again fired. The electrical interconnection then occurs from conductor 12 through solder fillet 15 to edge-around 11, then to conductor 8, and finally to resistive material 9. A cover coat 10 is illustrated which provides some limited environmental and physical protection to the resistor network. The covercoat may additionally provide a barrier beyond which the solder will not wick, further controlling the formation of the fillet 15 during reflow.

Figure 4:
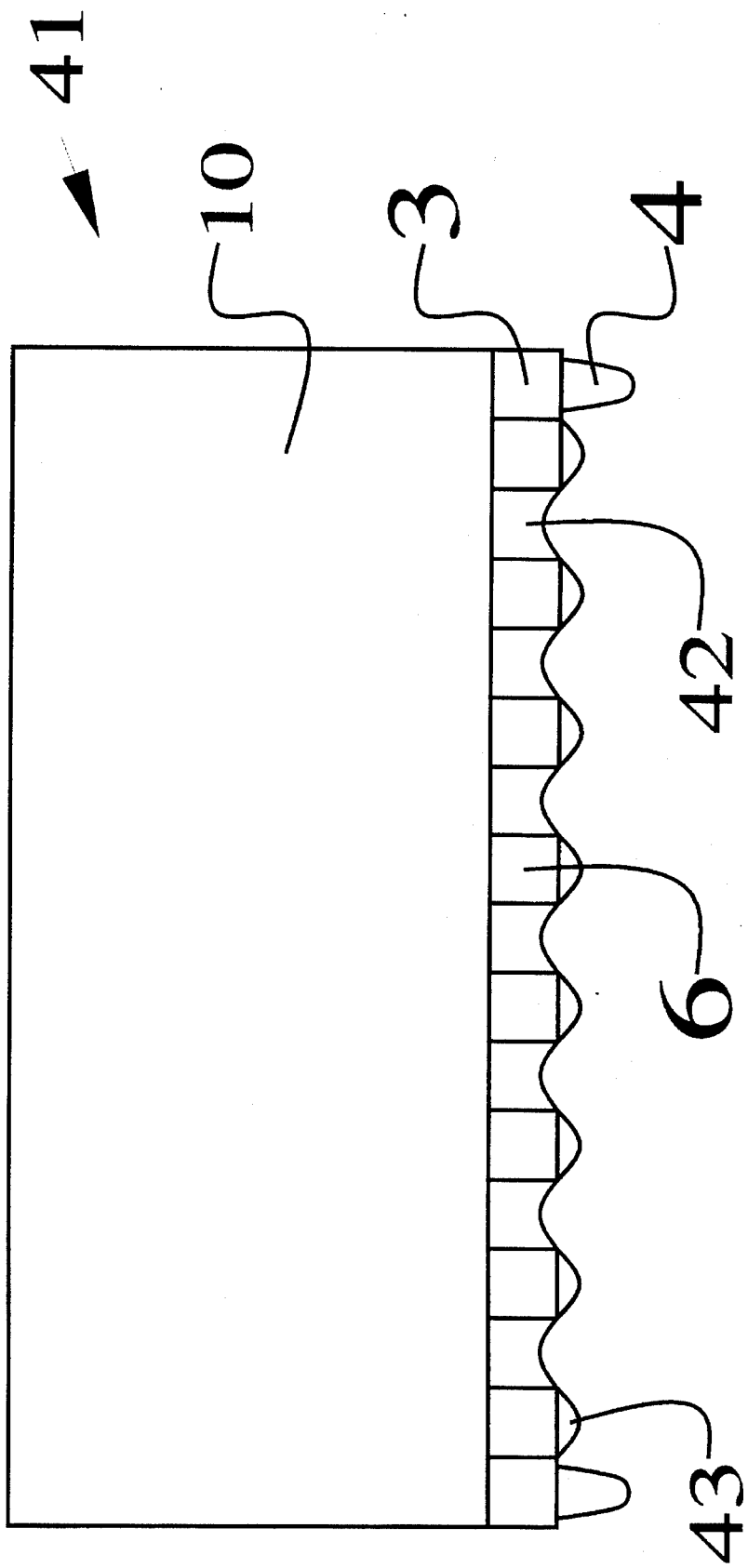
FIG. 4 illustrates an alternative embodiment of the surface mount resistor network in an unmounted configuration.

Referring now to the first alternative embodiment illustrated in FIG. 4, generally referred to as network 41, like elements have been similarly numbered as in previous figures. Covercoat 10, ceramic generally planar surface 3 and stand-offs. 4 are similar to those illustrated and previously discussed. However, in place of smaller stand-offs 5, network 41 has slightly grooved portions 42. These grooves, as with previously discussed groove 7, provide a region of bare ceramic of extended length and increased volume between solder bump terminations 6. Further, these grooved portions 42 serve to provide a solder barrier between adjacent solder bump terminations 6. Additionally, the open area formed by these grooves assists during cleaning procedures such as flux removal by providing small openings surrounding each termination where cleaning fluids may access the surfaces.

Figure 5:
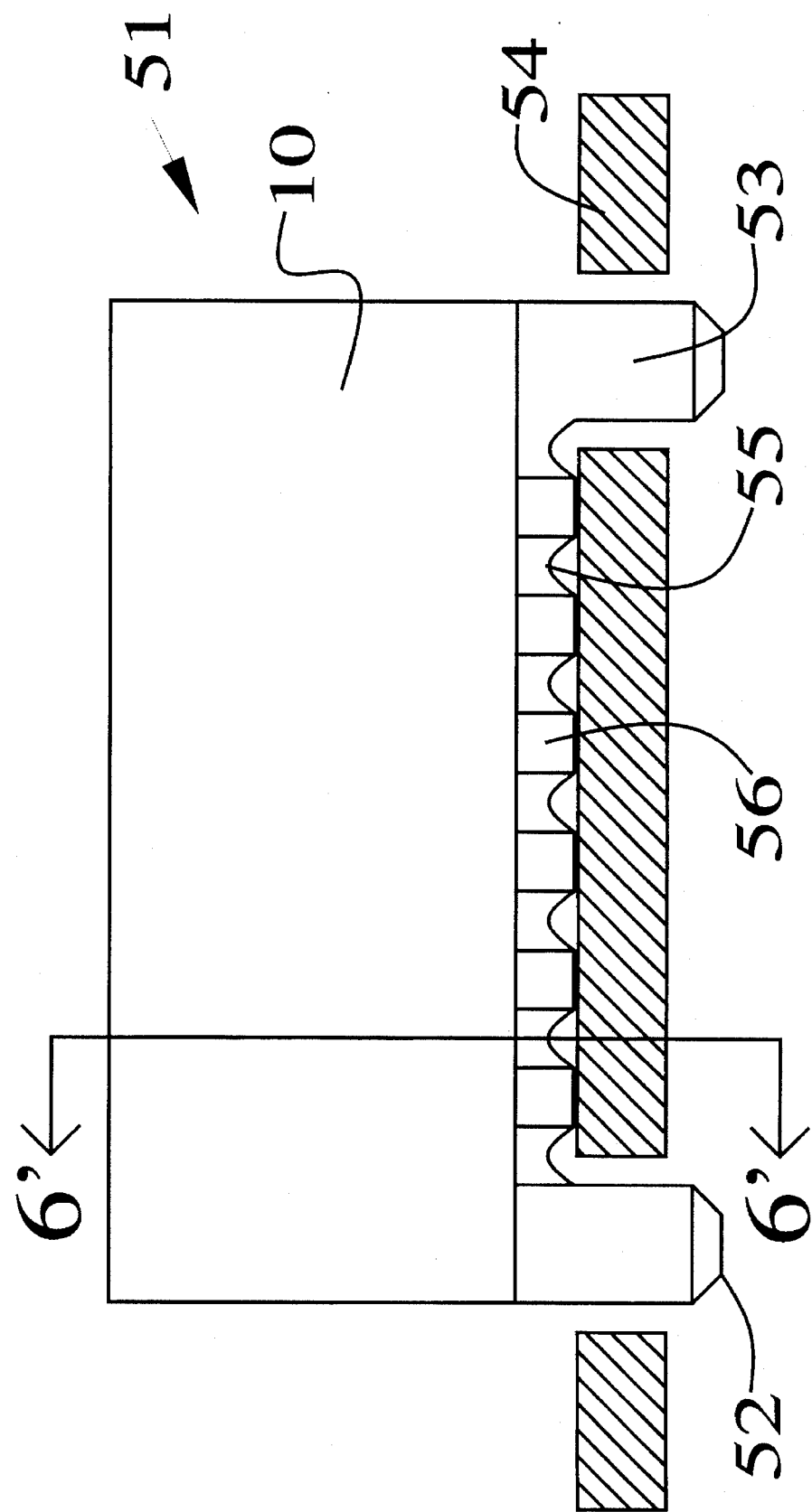
FIG. 5 illustrates a second alternative embodiment of a surface mounted resistor network.
Figure 6:
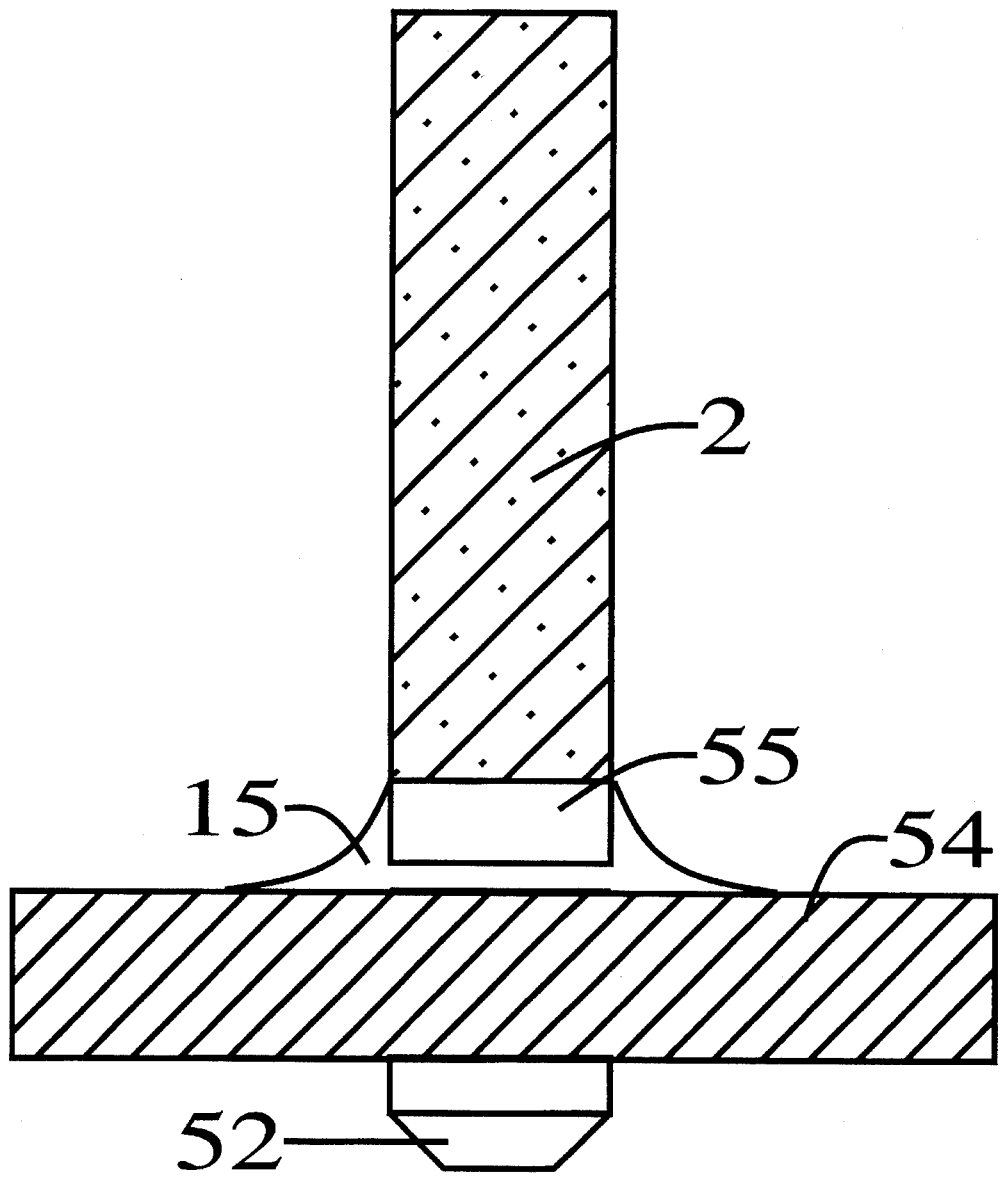
FIG. 6 illustrates a cross sectional view of the second alternative embodiment from FIG. 5 taken along section line 6'.

A second alternative embodiment is illustrated in FIGS. 5 and 6. This network is a surface mount SIP, as may be best seen from FIG. 6. Many of the features found in a resistor network such as resistors 9, conductors 8, and wiring board conductors 12 have not been illustrated for clarity of concept, but are understood to be included therein. This embodiment, generally identified as network 51, is mounted upon a wiring board 54. The mounting is accomplished by the insertion of ceramic legs 53 through wiring substrate 54. The legs 53 are illustrated as having tapered or chamfered ends 52, though any suitable shape for the legs 53 and ends 52 is considered to be incorporated herein. The legs provide stability for the resistor network prior to solder attachment operations and additionally provide physical alignment of the network 51 and associated terminations 56 relative to the wiring substrate 54. Grooves 55 perform similarly to grooves 42 illustrated and discussed with reference to FIG. 4. Terminations 56 likewise are very similar to solder bump terminations 6 illustrated in FIG. 1 and would generally be formed in the same manner.

Referring specifically to FIG. 6, a cross-sectional view taken along line 6' of FIG. 5, again with some elements omitted but presumed to be included, the wiring substrate 54 may be seen to surround each leg 53. One half of groove 55 is visible, and solder fillet 15 which bridges between terminations 56 and the wiring substrate conductors is also visible.

While the second alternative embodiment has been illustrated as a SIP, the inventors also contemplate a DIP formed by inclusion of groove 7. Such a groove might not necessarily run the full length of the substrate, but instead might only extend the distance occupied by terminations 56.

While the foregoing details what is felt to be the preferred embodiment of the invention, no material limitations to the scope of the claimed invention is intended. Further, features and design alternatives which would be obvious to one of ordinary skill in the art are considered to be incorporated herein. For example, the preferred embodiment illustrates ceramic resistor networks, while the features of the invention would be applicable to other substrate materials and other networks, including polymer substrates and insulated metal substrates, resistor-capacitor networks, capacitor networks, hybrids and other circuit combinations where the designer might find the application to merit incorporation of the inventive features into such a substrate. Additionally, the preferred embodiment has been illustrated with solder connections to the wiring substrate. However, application of the invention certainly includes consideration of the use of other methods of termination, including for example conductive epoxy. Additionally, the preferred embodiment has been illustrated with covercoat material, but no such covercoat 10 may be necessary. The scope of the invention is set forth and particularly described in the claims hereinbelow.

We claim:

1. A surface mount device for mounting on a printed circuit board, said surface mount device comprising:
   a mechanically unyielding substrate;
   mechanically unyielding terminations partially covering a surface of said substrate and extending inconsequentially from said surface;
   spacers integral to said surface mount device for holding said terminations a defined and reproducible distance from said printed circuit board; and
   solder barriers formed from said substrate between adjacent terminations.

2. The surface mount device of claim 1 wherein said solder barriers are comprised by bump-like protrusions extending from said surface.

3. The surface mount device of claim 1 wherein said solder barriers are comprised by grooves extending into said surface of said substrate.

4. The surface mount device of claim 3 further comprising a resistor network formed upon said substrate.

5. The surface mount device of claim 3 wherein said substrate is comprised by a ceramic composition.

6. The surface mount device of claim 5 wherein said terminations are comprised by a cermet glaze.

7. An electrical device comprising:
   a resistor network having a plurality of resistors carried upon a mechanically unyielding network substrate, said resistors terminated through mechanically unyielding network terminations formed upon said network substrate in coplanar relation and separated therebetween by isolation means;
   a carrier substrate having a pattern of electrical connectors electrically interconnected to said resistor network terminations through a solder composition;
   said resistor network further comprising integral spacers protruding from said network substrate maintaining a defined and reproducible spacing between said resistor network terminations and said carrier substrate;
   said solder composition forming controlled fillets from said network to said carrier substrate and deforming elastically on differing motion between said resistor network and said carrier substrate;
   said isolation means enhancing electrical and physical isolation between adjacent fillets.

8. The electrical device of claim 7 wherein said network terminations are composed of a cermet glaze.

9. The electrical device of claim 8 wherein said network substrate is composed of a ceramic material.

10. The electrical device of claim 7 wherein said network substrate is composed of a ceramic material.

11. The electrical device of claim 7 wherein said isolation means provide spaces that separate said terminations and further allow visual inspection and cleaning therebetween.

12. The electrical device of claim 7 further comprised by resistor network terminations forming two parallel lines, said isolation means formed along lines perpendicular to and parallel to said network terminations.

13. The electrical device of claim 7 wherein said solder composition is fluent when in a molten state and otherwise substantially non-fluent.

* * * * *